(12) United States Patent
Waters (10) Patent No.: US 10,775,001 B1
(45) Date of Patent: Sep. 15, 2020

(54) COMPACT FLASHLIGHT

(71) Applicant: Waters Industries, Inc., West Dundee, IL (US)

(72) Inventor: Michael Waters, Aspen, CO (US)

(73) Assignee: Waters Industries, Inc., West Dundee, IL (US)

( * ) Notice: Subject to any disclaimer, the term of this patent is extended or adjusted under 35 U.S.C. 154(b) by 0 days.

(21) Appl. No.: 16/379,541

(22) Filed: Apr. 9, 2019

(51) Int. Cl.
*F21V 23/00* (2015.01)
*F21L 4/02* (2006.01)
*F21V 23/04* (2006.01)
*H05K 1/18* (2006.01)

(52) U.S. Cl.
CPC ............ *F21L 4/027* (2013.01); *F21V 23/009* (2013.01); *F21V 23/0414* (2013.01); *H05K 1/18* (2013.01)

(58) Field of Classification Search
CPC .... F21L 4/027; F21V 23/009; F21V 23/0414; F21V 21/145; F21V 21/16; H05K 1/18; F21Y 2115/10
See application file for complete search history.

(56) References Cited

U.S. PATENT DOCUMENTS

| | | | | |
|---|---|---|---|---|
| 1,360,477 | A | * | 11/1920 | Wachtel ................... F21L 4/00 362/205 |
| 1,874,229 | A | * | 6/1929 | Battery ............... F21V 23/0414 192/113.5 |
| 561,575 | A | * | 12/1942 | Lanchester ........... F21V 19/047 362/189 |
| 2,401,349 | A | * | 6/1946 | Hedge ....................... F21L 4/00 362/189 |
| 3,504,170 | A | * | 3/1970 | Thompson ............... F21L 15/00 362/194 |
| 5,806,960 | A | * | 9/1998 | Chien .................. A43B 1/0036 362/190 |
| 6,039,456 | A | | 3/2000 | Chabria |
| 6,168,288 | B1 | | 1/2001 | St Claire |
| 6,511,202 | B1 | | 1/2003 | Henry |
| D485,631 | S | | 1/2004 | Campman |
| D485,632 | S | | 1/2004 | Campman |
| D485,926 | S | | 1/2004 | Campman |
| 6,695,459 | B2 | | 2/2004 | Collins |
| 6,793,366 | B2 | | 9/2004 | Chun |
| 6,874,907 | B2 | | 4/2005 | Liao |
| 6,893,142 | B2 | | 5/2005 | Collins |
| 7,151,433 | B2 | | 12/2006 | Chun |
| 7,185,997 | B2 | | 3/2007 | Simoni |
| 7,214,952 | B2 | | 5/2007 | Klipstein |

(Continued)

*Primary Examiner* — Isiaka O Akanbi
*Assistant Examiner* — Fatima N Faokhrooz
(74) *Attorney, Agent, or Firm* — Fitch, Even, Tabin & Flannery LLP (57) ABSTRACT

A flashlight comprising a housing, a circuit board fixed in the housing and having opposite main surfaces with the circuit board oriented so that a first one of the main surfaces faces in a first direction and a second one of the main surfaces faces in a second, opposite direction, a light source disposed on the second main surface of the circuit board, an electrical contact mounted on the first main surface of the circuit board to be fixed in the housing, a battery having opposite first and second ends and having a first terminal at the first end thereof, and a conductive band electrically coupled to the circuit board and engaging the second end of the battery to bias the first terminal towards the electrical contact.

15 Claims, 10 Drawing Sheets

(56) References Cited

U.S. PATENT DOCUMENTS

| | | |
|---|---|---|
| D571,492 S | 6/2008 | Lee |
| D571,941 S | 6/2008 | Lee |
| 7,394,220 B2 | 7/2008 | Huang |
| 7,490,951 B2 | 2/2009 | Klipstein |
| D587,830 S | 3/2009 | King |
| D595,875 S | 7/2009 | Irvine |
| 7,651,239 B2 | 1/2010 | Spartano |
| D615,676 S | 5/2010 | Lee |
| 7,950,818 B2 | 5/2011 | Klipstein |
| 7,959,317 B2 | 6/2011 | Spartano |
| D657,484 S | 4/2012 | Liuning |
| 8,388,167 B2 | 3/2013 | Klipstein |
| D699,378 S | 2/2014 | DiLuciano |
| D729,095 S | 5/2015 | Chiang |
| 9,057,490 B2 | 6/2015 | Sharrah |
| 9,074,739 B2 | 7/2015 | Deighton |
| 9,121,556 B1 | 9/2015 | McDermott |
| D753,855 S | 4/2016 | Cacciabeve |
| D777,362 S | 1/2017 | Killion |
| 9,583,028 B2 | 2/2017 | Killion |
| D805,666 S | 12/2017 | Loc |
| D824,557 S | 7/2018 | Waters |
| D827,890 S | 9/2018 | Mullani |
| D829,354 S | 9/2018 | Cacciabeve |
| 1,006,931 A1 | 9/2018 | Waters |
| 2005/0122713 A1 | 6/2005 | Hutchins |
| 2005/0152137 A1 | 7/2005 | Opolka |
| 2005/0162127 A1 | 7/2005 | Hutchins |
| 2005/0231941 A1 | 10/2005 | Huang |
| 2006/0007676 A1 | 1/2006 | Song |
| 2006/0104078 A1 | 5/2006 | Peng |
| 2006/0170393 A1 | 8/2006 | Yang |
| 2006/0176685 A1* | 8/2006 | Galli ............... F21L 4/005 362/157 |
| 2007/0159816 A1* | 7/2007 | Bayat ............... F21V 7/0075 362/184 |
| 2008/0198615 A1* | 8/2008 | Klipstein ............ B60Q 1/0483 362/538 |
| 2011/0007502 A1* | 1/2011 | Chen ............... F21L 4/027 362/191 |
| 2011/0211351 A1* | 9/2011 | Van De Ven ........ F21V 29/70 362/249.02 |
| 2015/0330618 A1* | 11/2015 | McDermott ......... F21L 4/027 362/203 |
| 2016/0091153 A1* | 3/2016 | McLennan ........... F21L 4/045 362/183 |
| 2017/0009972 A1* | 1/2017 | Walker .............. A47J 31/4403 |
| 2017/0299165 A1* | 10/2017 | Shoulders .......... F21V 23/0421 |

* cited by examiner

COMPACT FLASHLIGHT

FIELD

The invention relates to flashlights and, more specifically, to compact flashlights.

BACKGROUND

Often an individual desires a portable light source focused to illuminate an area while performing a task. Battery powered flashlights are commonly used in these scenarios. Standard flashlights include a body for housing batteries which are biased into engagement with an electrical contact by a coil spring. A head is situated at one end of the body to house a bulb. Often times the head further includes a conical reflector to direct light form the bulb. Standard flashlights are large enough that they are not generally carried by individuals when not in use. Instead they are stored, requiring the individual to locate and retrieve a flashlight when needed.

DETAILED DESCRIPTION OF THE PREFERRED EMBODIMENTS

Compact flashlights are provided herein that are advantageously sized to fit within small spaces such as those found in pockets, purses, or the like. The flashlights described herein utilize LEDs to provide high intensity light while taking up a small amount of space.

In an exemplary form, the flashlight includes a housing assembly and a circuit board fixed within the housing assembly. The circuit board has a first main surface facing in a first direction (e.g., rearward) and an opposite, second main surface facing in a second direction (e.g., forward).

A light source is disposed on the second main surface of the circuit board such that the light source emits light in the second direction when powered. At least one electrical contact is mounted on the first main surface of the circuit board. The flashlight further includes a battery having a first end and an opposite, second end with a first terminal at the first end thereof. A band is coupled to the circuit board and is configured to engage the second end of the battery to bias the first terminal towards the electrical contact.

Figure 1:
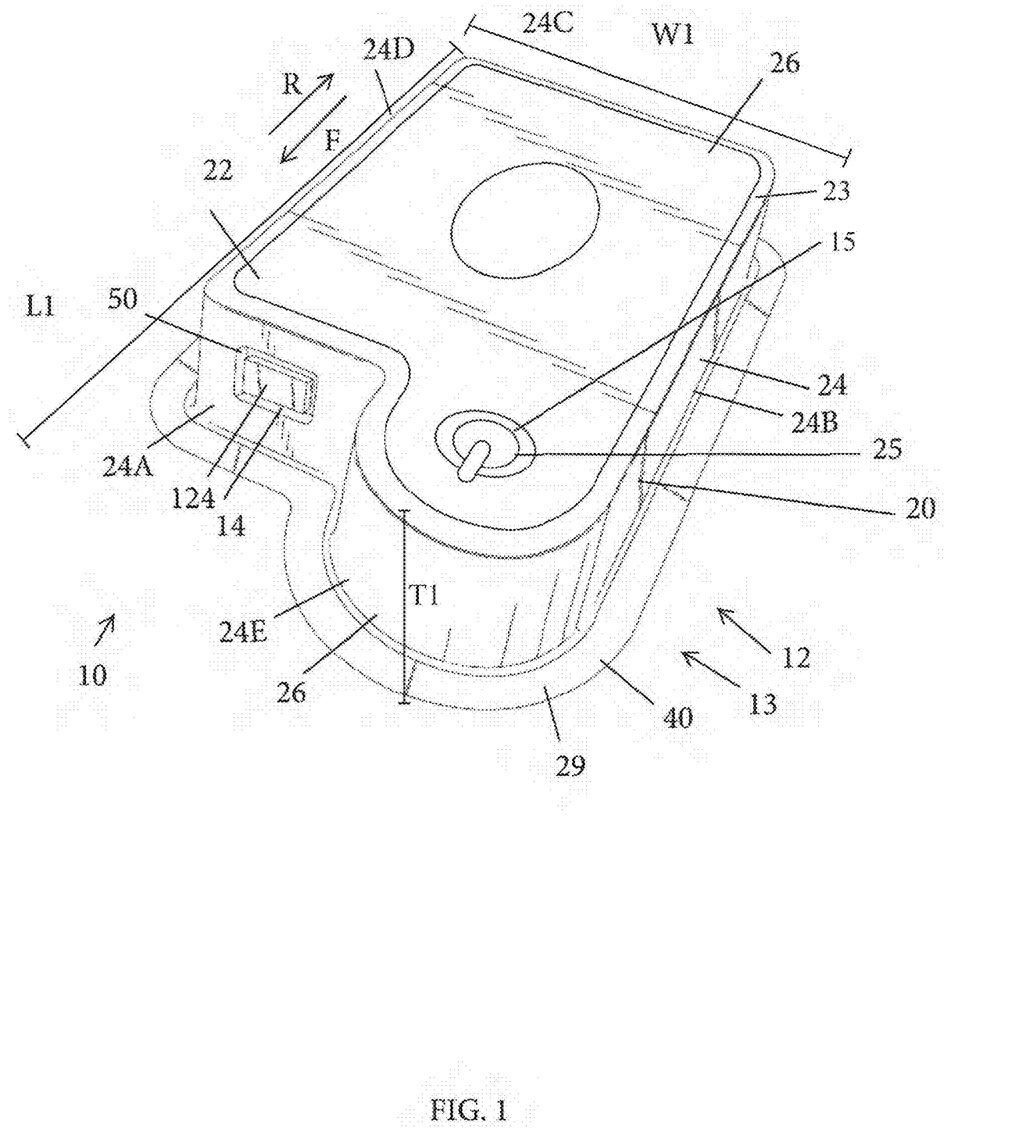
FIG. 1 is a perspective view of a compact flashlight in accordance with the present invention.
Figure 2:
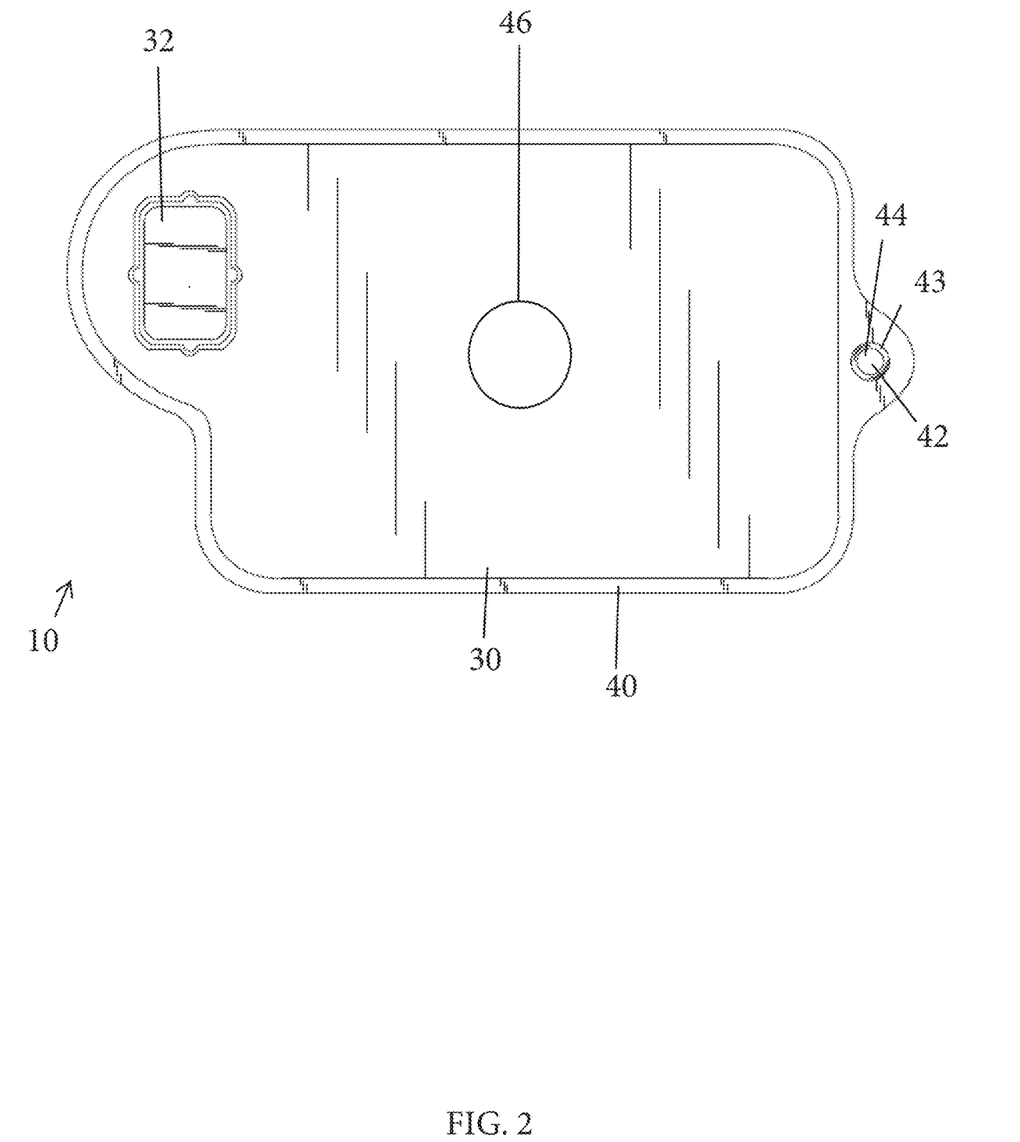
FIG. 2 is a bottom plan view of the flashlight of FIG. 1 showing attachment structures for storing the flashlight.
Figure 3:
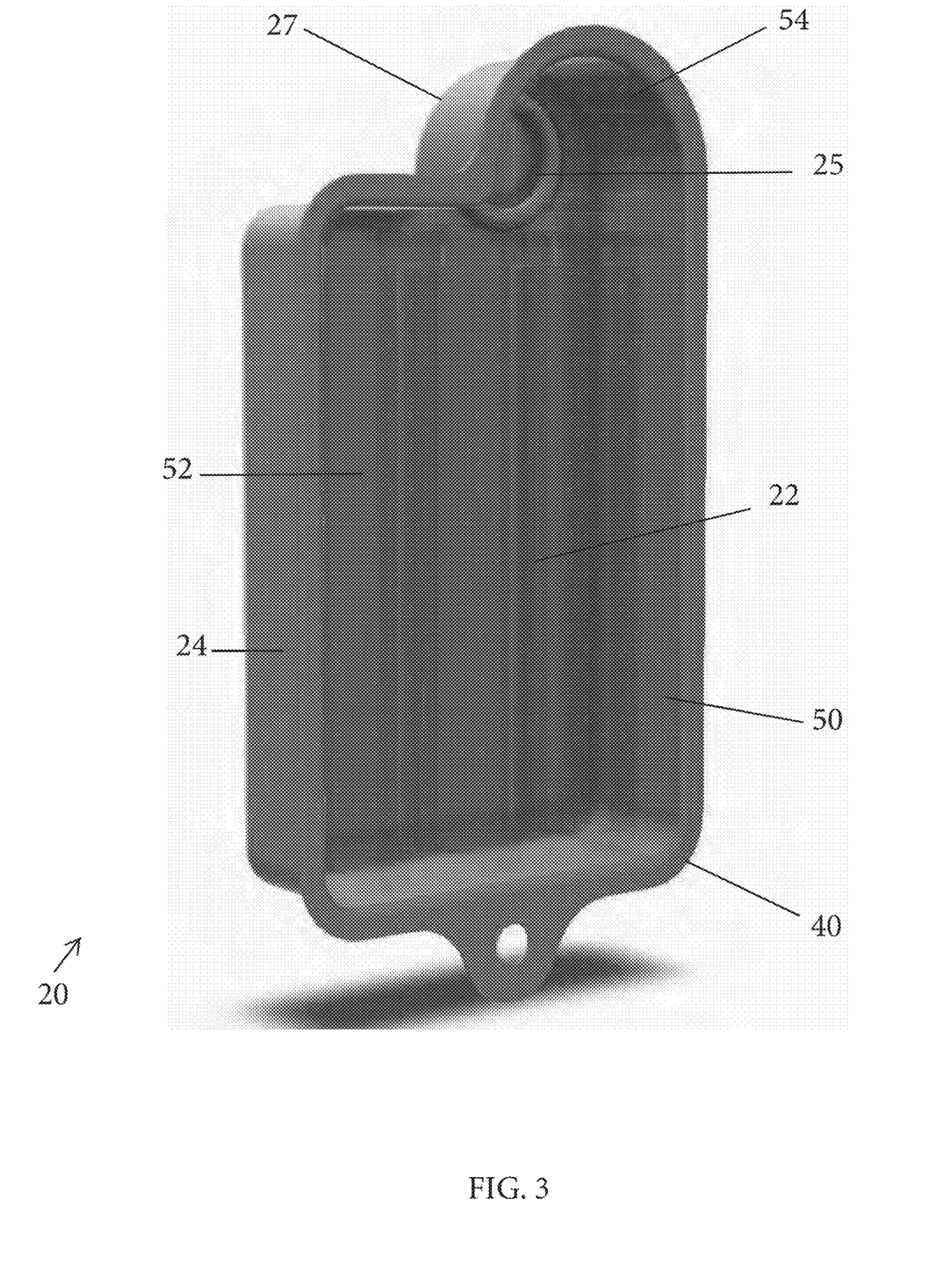
FIG. 3 is a bottom perspective view of a main housing portion of the housing the flashlight of FIGS. 1 and 2 showing the internal cavity thereof.

A flashlight 10 having these features is shown in FIGS. 1-8. The flashlight 10 includes a compact housing assembly 12 sized to receive an internal lighting assembly 100 (FIG. 4) therein. Referring to FIG. 3, the housing assembly 12 includes a first or main housing portion or member 20 which defines a cavity 50 for containing the lighting assembly 100. The first housing member 20 has a downwardly open configuration including a generally planar top wall portion 22 and a sidewall portion 24 extending downward from the top wall portion 22 to form a perimeter corner junction 23 therewith. The sidewall portion 24 includes four substantially straight or planar sidewall sections 24A-24D with adjacent sidewall sections 24A-24D extending substantially perpendicular to one another. As shown in FIG. 1, the opposing sidewall sections 24B and 24D are substantially equal in length and longer than opposing sidewall sections 24A and 24C. Sidewall section 24A is shorter than opposing sidewall section 24C and extends from adjacent sidewall section 24D to a projecting arcuate wall section 24E that extends outward from the end of side wall section 24A to form a substantially semi-circular corner protrusion 27 of the housing member 20. A flange portion 40 extends laterally outwardly from the bottom edge of the sidewall portion 24.

The housing assembly 12 further includes a second housing portion or member 30. The second housing member 30 is substantially planar and is sized to extend to the outer periphery 29 of the first housing member 20 at the flange portion 40 thereof. The two housing members 20, 30 are of plastic materials that are bonded together along the flange portion 40 to form an outer shell 13 enclosing the cavity 50 with a watertight seal for providing protection to the components of the internal lighting assembly 100.

Figure 4:
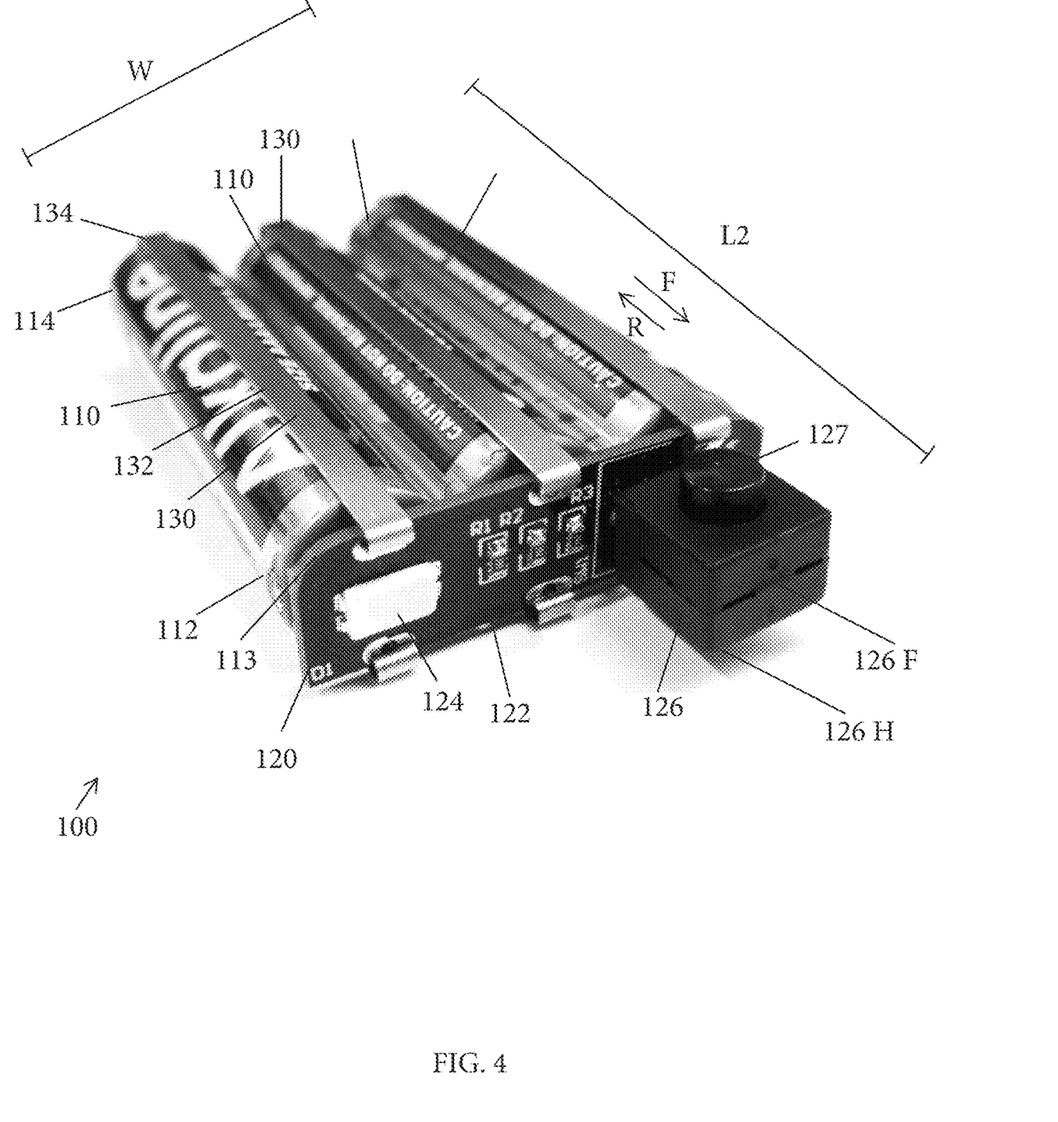
FIG. 4 is a perspective view of the flashlight of FIGS. 1 and 2 with the housing removed to show an internal lighting assembly including a circuit board and batteries electrically connected thereto via respective conductive bands that wrap around the batteries.
Figure 5:
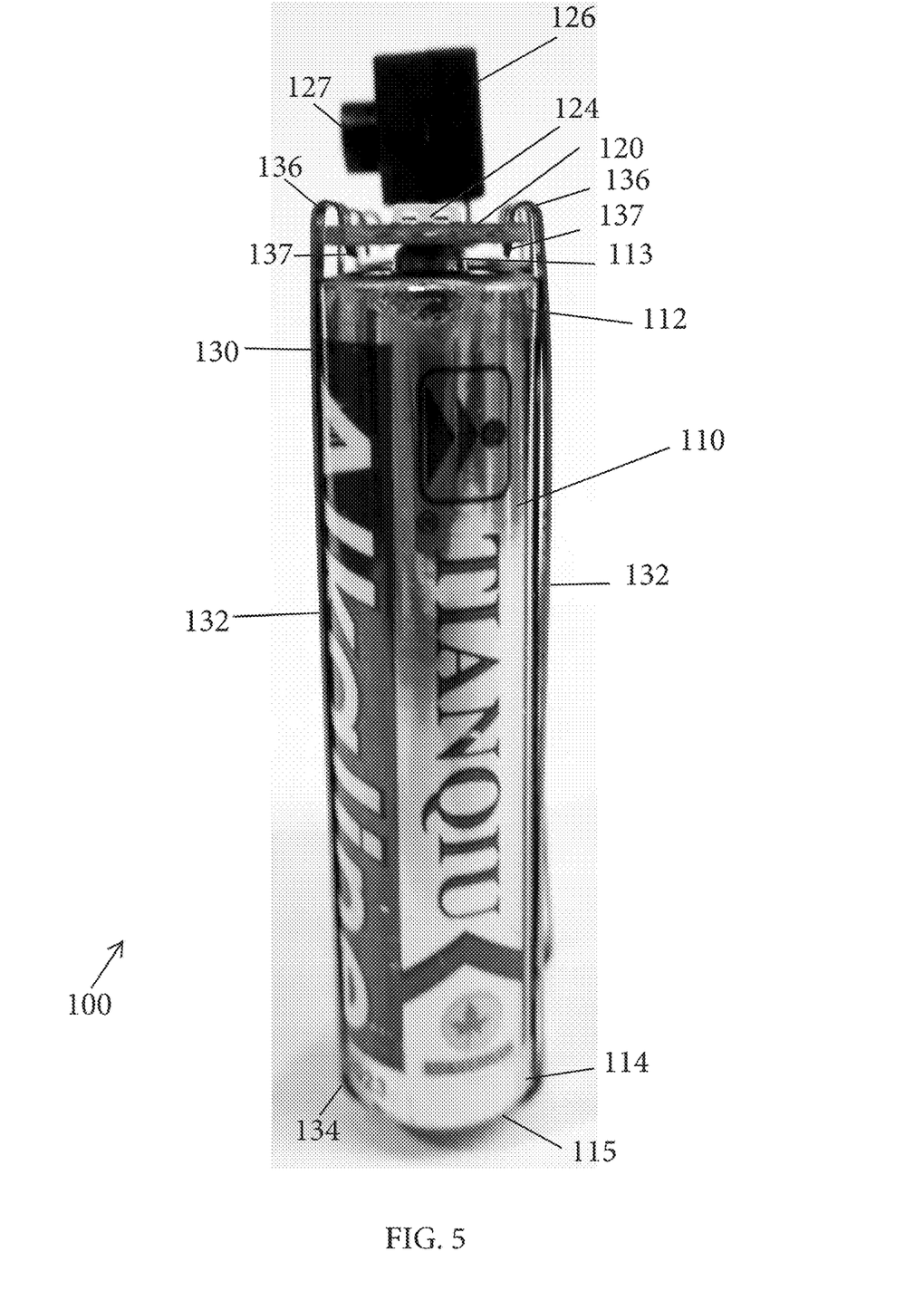
FIG. 5 is a right side elevation view of the flashlight of FIGS. 1-4 showing the engagement between a terminal of one of the batteries and the circuit board, and ends of the band secured to the circuit board.

The internal lighting assembly 100 of the compact flashlight 10 is shown in FIGS. 4 and 5. The lighting assembly 100 includes a circuit board 120 having a first main surface 121 and an opposite, second main surface 122. The first main surface 121 faces in a first, rearward direction R and the second main surface 122 faces in an opposite, second, forward direction F. A light source 124 is disposed on the second main surface 122 of the circuit board 120. The light source 124 can be a light emitting diode (LED). In a preferred form, the light source 124 is a chip-on-board LED. The lighting assembly 100 further includes a switch 126 disposed on the second main surface 122 of the circuit board 120. The switch 126 is operable to selectively supply power to the light source 124. The switch 126 can be a push-button switch that includes an actuator or plunger 127 that is operable by a user to shift the switch 126 between an open state, in which the light source 124 is off, and a closed state, in which the light source 124 is on.

The lighting assembly 100 further includes at least one elongate battery 110, and preferably multiple batteries 110 as discussed further hereinafter. The elongate battery 110 has a first end 112 and a second end 114. The first end 112 is proximate the circuit board 120 and the second end 114 is spaced distally from the circuit board 120. The elongate battery 110 has a first electrical terminal 113 at the first end 112 thereof and a second electrical terminal 115 at the second end 114 thereof. As shown, the elongate battery 110 is a standard size cylindrical-shaped battery, such as a AA battery or AAA battery. Alternatively, the elongate battery 110 is formed of two or more batteries stacked to electrically engage each other in series. The first terminal 113 of the elongate battery 110 directly engages an electrical contact 129 (see, FIG. 8) on the first main surface 121 of the circuit board 120 to form an electrical connection therewith.

A band 130 is configured to wrap around the distal, second end 114 of the elongate battery 110 in engagement with the terminal 115 that is flush with the end 114 of the battery 110. The band 130 is fixedly secured to the circuit board 120 and biases the elongate battery 110 towards the circuit board 120 so as to hold the projecting, small first terminal 113 in secure electrical engagement with the contact 129.

The lighting assembly 100 has a compact design driven by the size of the elongate batteries 110. The width W2 of the lighting assembly 100 is substantially equal to the combined width of the batteries 110. In one form, the circuit board 120 has a thickness of less than approximately ⅛ inch. The light source 124 projects less than approximately ⅛ inch in the forward direction, F, from the second main surface 122 of the circuit board 120. The switch 126 extends less than approximately ½ inch in the forward direction, F, from the second main surface 122 of the circuit board 120 to which it is mounted. The lighting assembly 100 has an overall length L2 less than approximately 130% the length of an elongate battery 110. As shown in FIG. 4, the length L2 is from the distal end of the band 130 wrapped around the battery end 114, described in more detail below, and the forward side 126F of the switch housing 126H. In an alternative form, the switch 126 does not project from the second main surface 122 such that the overall length L2 is less than approximately 110% the length of an elongate battery 110.

Figure 6:
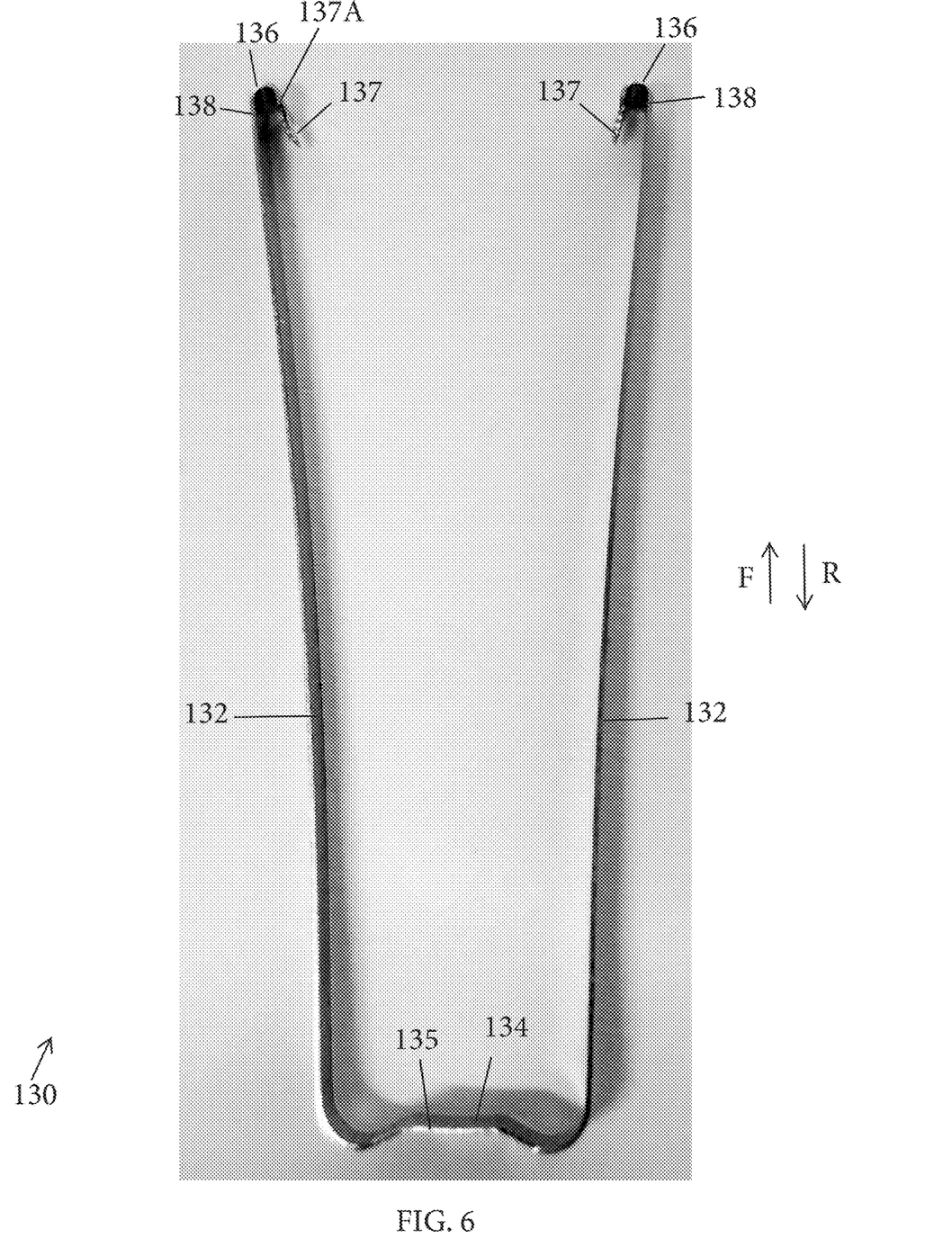
FIG. 6 is a side elevation view of one of the bands of the flashlight of FIG. 4 showing the generally U-shaped configuration of the band.

As shown in FIG. 6, each of the bands 130 has a generally U-shaped configuration including two elongate side members 132 which extend along opposite sides of the elongate battery 110 and a base or cross member 134 connecting the elongate side members 132 together. The band 130 is formed of a resilient material, such as a thin conductive metal. In an undeformed state, the cross member 134 includes an indented, bent central section 135 extending in the second direction F to be disposed between the band side portions 132 forwardly of the junctures between the cross member 134 and the side portions 132.

With the band 130 connected to the circuit board 120 as described further below and without the battery 110 in place, the distance between the undeformed bent central section 135 and the first main surface 121 of the circuit board 120 is slightly less than the overall length of the elongate battery 110. Accordingly, when the lighting assembly 100 is assembled, placing the elongate battery 110 between the cross member 134 and the circuit board 120 deforms the cross member 134 to urge the bent central section 135 rearwardly to deform and at least partially straighten the bent central section 135. The resiliency of the band 130 causes a spring force to be exerted by the deformed bent central section 135 against the battery 110 in the second, forward direction F so as to bias the projecting, small end terminal 113 of the battery 110 into tight engagement with the contact 129 of the circuit board 120.

Figure 8:
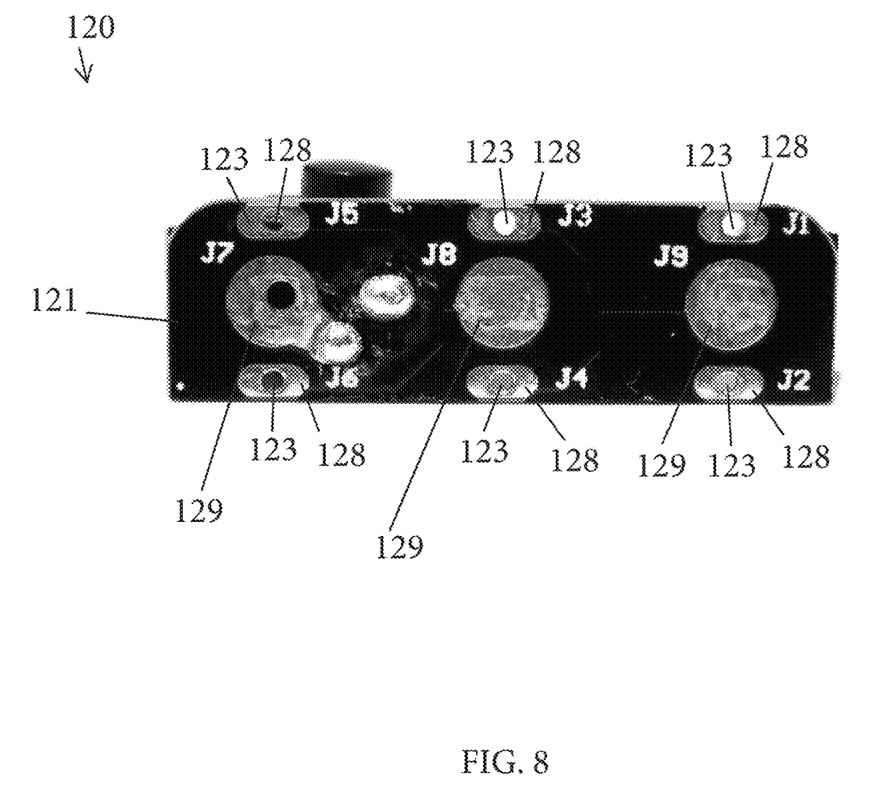
FIG. 8 is a rear elevation view of the circuit board of FIG. 4 showing the contact pads for electrically coupling the circuit board to the batteries.

The band 130 can include hook portions 136 at the free ends 138 of the elongated side members 132. The hook portions 136 are configured to engage the circuit board 120 from the second main surface 122 to electrically couple the band 130 and fixedly secure it to the circuit board 120. The above-described configuration and sizing of the band 10 relative to the battery 110 acts to bias the hook portions 136 into secure engagement with the circuit board 120. The hook portions 136 include narrow, end protrusions 137 extending in substantially the second, rearward direction R. Referring to FIGS. 4, 5 and 8, the protrusions 137 extend rearwardly through conductive through apertures 123 in the circuit board 120. To this end, the resilient engagement between the rear, bent central section 135 of the band 130 and the battery terminal 115 causes the narrow, end protrusions 137 to be urged rearwardly until transverse shoulder 137A between the narrow protrusion 137 and the wider remainder of the hook portion 136 tightly abuts the second main surface 122 of the circuit board 120 about the through apertures 123 with the protrusion 137 received therein.

Figure 7:
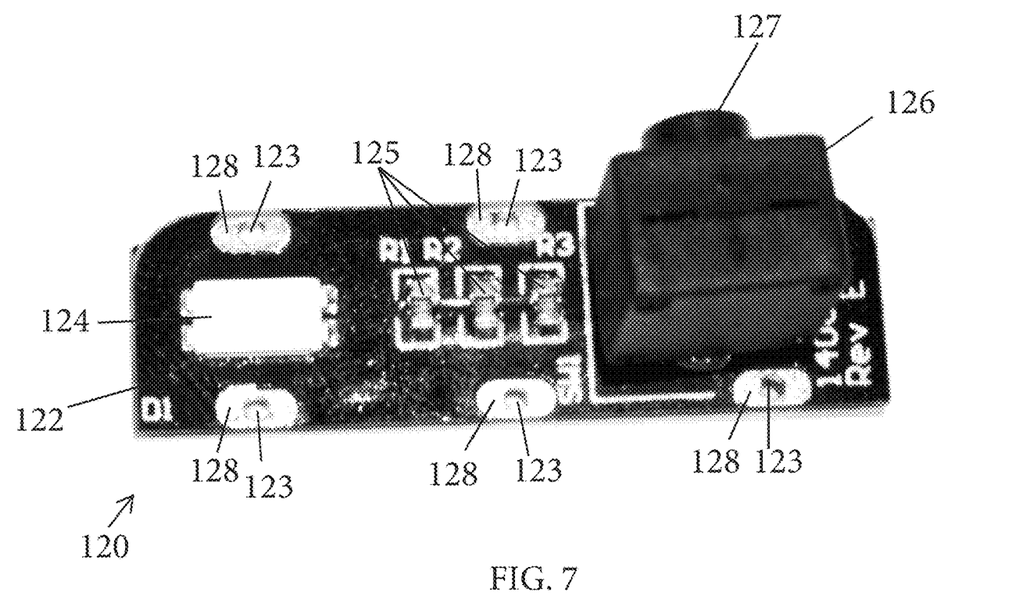
FIG. 7 is a front elevation view of the circuit board of FIG. 4 showing the second main surface having a light source and switch mounted thereto.

As mentioned, the band 130 is preferably formed of a conductive thin, metal material. The cross member 134 engages the second terminal 115 of the elongate battery 110 to form an electrical connection therewith. As described above, the shoulders 137A and the protrusions 137 of the hook portions 136 engage electrical contacts 128 of the circuit board 120 extending about and in the conductive aperture 123. The electrical contacts 128, 129, light source 124, and switch 126 are electrically coupled together by a conductive circuit trace of the circuit board 120 so as to form an electrical circuit in which the elongate battery 110 selectively powers the light source 124 as controlled by the switch 126. As shown in FIG. 7, the circuit board 120 can further include one or more resistors 125 mounted thereto along the circuit trace to drop the voltage of the circuit to a desired level with respect to the light source 124.

The lighting assembly 100 preferably includes a plurality of elongate batteries 110. In the illustrated and preferred form, three AAA batteries 110 and corresponding holding bands 130 are used in the lighting assembly 100. Each elongate battery 110 is held in engagement with a respective contact 129 by a respective band 130 as described above. The trace of the circuit board 120 is configured to electrically couple the plurality of elongate batteries 110 in parallel.

Referring to FIGS. 1-3, to provide the flashlight 10 with a compact configuration the sidewall portion 24 closely conforms to the shape of the outer periphery of the lighting assembly 100. The cavity 50 includes a main rectangular section 52 configured to receive the elongate batteries 110, bands 130, and circuit board 120. The cavity 50 further includes a switch receiving arched section 54 sized and shaped to receive the switch 126. The switch receiving arched section 54 extends in the forward direction F from the main rectangular section 52.

Accordingly, the overall size of the flashlight 10 is primarily driven by the size of the elongate batteries 110. In the illustrated form, the elongate batteries 110 include three standard AAA batteries, as discussed above. A standard AAA battery has a length of 1.75 inches and a diameter of 0.41 inches. The flashlight 10 has an overall length L1 of approximately 2.5 inches, a width W1 perpendicular to the length L1 of approximately 1.5 inches, and a thickness T1 perpendicular to both the width W1 and length L1 of approximately 0.5 inches. As shown in FIG. 1, the length L1 and width W1 are measured between corresponding edges of the flange portion 40 of the housing assembly 12, and the thickness T1 is measured between the flange portion 40 and the top wall portion 22 of the housing member 20. The three standard alkaline AAA batteries 110 can power a 75 lumen chip-on-board LED light source 124 for approximately 8-10 hours without needing to be replaced or recharged.

At least a section 25 of the first housing member 20 is deformable. The deformable section 25 is along the housing top wall portion 22 and is proximate and aligned with the actuator 127 of the switch 126. In operation, a user pushes the deformable actuator section 25 so it deforms inwardly into the cavity 50 and engages the actuator 127 to shift the switch 126 between on and off states thereof. The housing assembly 12 includes an indicator 15 on the top wall portion 22 thereof to that identify the location of the deformable actuator section 25. The deformed actuator section 25 depresses the actuator 127 into the switch housing 126H causing the switch 126 to toggle between states. When the deformable actuator section 25 is released it returns to the illustrated undeformed configuration with the actuator 127 returning to its extended state.

Only a small, forward-facing portion 14 of the housing assembly 12 is substantially translucent or transparent so that light emitted from the light source 124 projects out of the housing assembly 12 in the forward direction F. The transparent portion 14 is positioned proximate the light source 124 so as to allow light from the light source 124 to pass through the housing assembly 12. The housing assembly 12 apart from the transparent portion 14 is substantially opaque such that light from the light source is only emitted in the forward direction F.

The entire first housing member 20 can be formed of a substantially transparent or translucent material. One or more opaque inserts or covers are positioned on or within the first housing member 20 to block light from the light source 124 from passing through the housing assembly 12 in directions other than the second, forward direction F. The flashlight 10 includes a printed sticker 26 applied to the top wall portion 22 of the housing assembly 12. The sticker 26 is opaque and thus blocks light from being emitted through the top wall portion 22. The sticker 26 further includes indicia, such as the indicator 15 discussed above.

Figure 9:
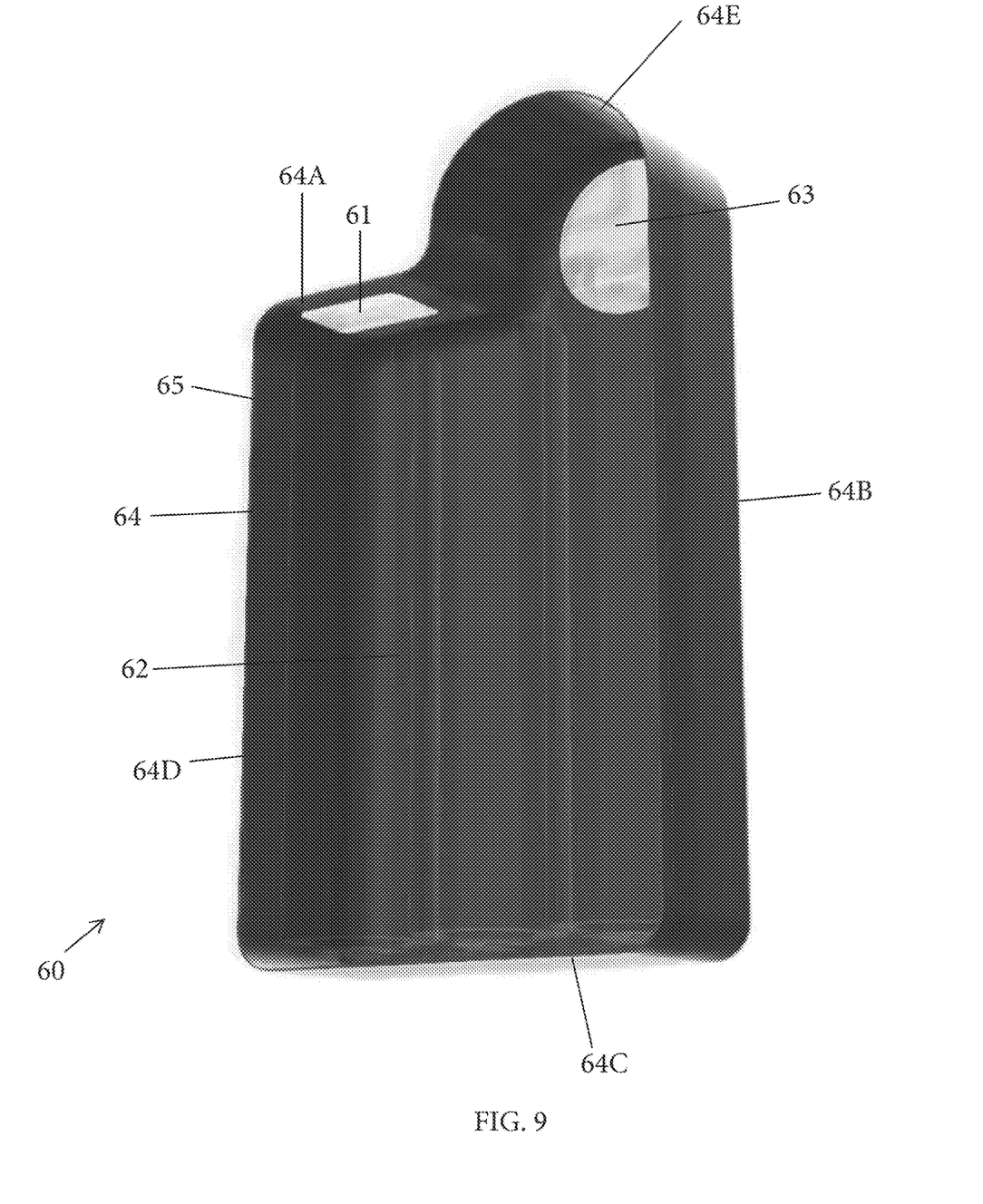
FIG. 9 is a bottom perspective view of an opaque housing insert showing the internal cavity thereof sized for carrying the lighting assembly.

Light is further blocked by the opaque insert 60 shown in FIG. 9. The insert 60 has substantially the same configuration as the first housing member 20. The insert 60 has a generally planar top wall portion 62 and a sidewall portion 64 extending downward from the top wall portion 22 to form a perimeter corner junction therewith and defining cavity 65 of the insert 60. The sidewall portion 64 includes four substantially planar or straight sidewall sections 64A-64D with adjacent sidewall sections 64A-64D extending substantially perpendicular to one another. The opposing sidewall sections 64B and 64D are substantially equal in length and longer than opposing sidewall sections 64A and 64C. Sidewall section 64A is shorter than opposing sidewall section 64C and extends from adjacent sidewall section 64D to a projecting arcuate wall section 64E that extends outward from the end of side wall section 64A. The insert 60 is sized to be slightly smaller than the first housing member 20 to snugly fit in the cavity 50 with the arcuate wall section 64E nesting within the corner protrusion 27 of the housing member 20. The lighting assembly 100 is in turn fit in the cavity 65 of the insert 60.

The insert 60 includes a cut-out window opening 61 in side wall section 64A to be positioned proximate the light source 124. In operation, light from the light source 124 is emitted through the opening 61 to project light in the forward direction F. The opaque insert 60 blocks light from being emitted through portions of the insert 60 other than the aperture 61. The insert 60 further includes a second cut-out opening 63 in the top wall portion 62 adjacent the arcuate wall section 64E. The second opening 63 is positioned so that the actuator 127 of the switch 126 is exposed therein. The actuator 127 can extend at least partially through the second opening 63 to be closely adjacent or engage with the deformable actuator section 25 of the first housing member 20.

As shown, the insert 60 opens downwardly and thus does not block light from being emitted in the downward direction. The second housing member 30 is formed of an opaque material to block light from being emitted from the light source 124 in the downward direction. In other forms, the second housing member 30 is transparent or translucent and is covered by an opaque cover similar to the sticker 26 to block light from being emitted in the downward direction.

Referring to FIG. 2, the second housing member 30 includes an indentation 32 extending into the cavity 50. The indentation 32 is positioned proximate the switch 126 on a bottom side of the switch housing 126H opposite the deformable actuator section 25. The indentation 32 supports the switch 126 against the force of actuation by distributing the force exerted by the switch 126 against the second housing member 30 along the generally vertical walls of the indentation 32, thus resisting deformation of the second housing member 30 downwardly when a user pushes the deformable actuator section 25 to allow the LED light source 124 to be easily toggled between on and off states when the deformable actuator section 25 is pushed.

Figure 10:
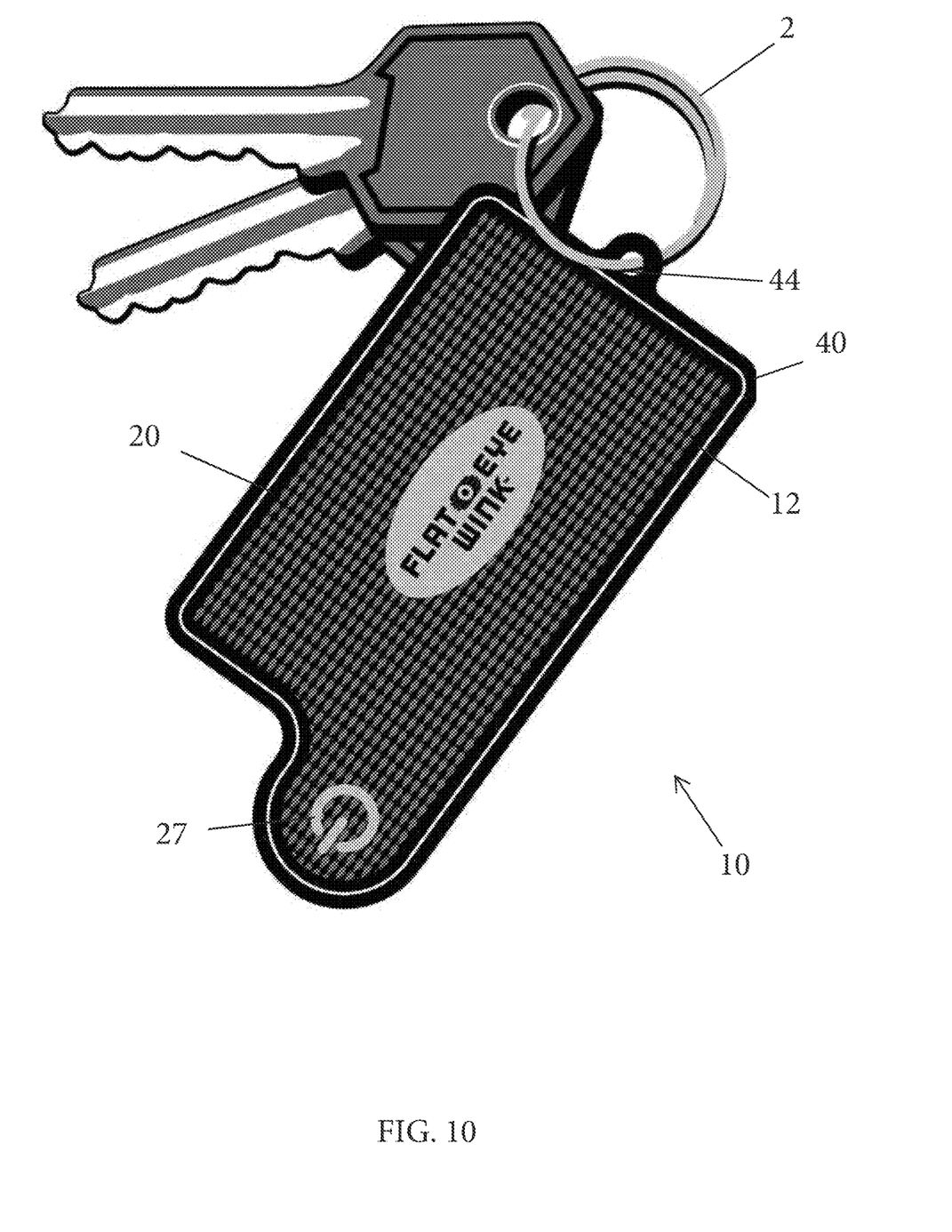
FIG. 10 is a perspective view of the flashlight of FIGS. 1 and 2 coupled to a key ring.

The flange portion 40 can include an attachment structure 42. The attachment structure 42 is an aperture 44 through the flange 40 configured to receive an external structure. For example, the aperture 44 receives a key ring 2 as shown in FIG. 10 in order to store the flashlight 10. The attachment structure 42 preferably includes a metal grommet 43 to reinforce the flange 40, as shown in FIG. 2.

Figure 11:
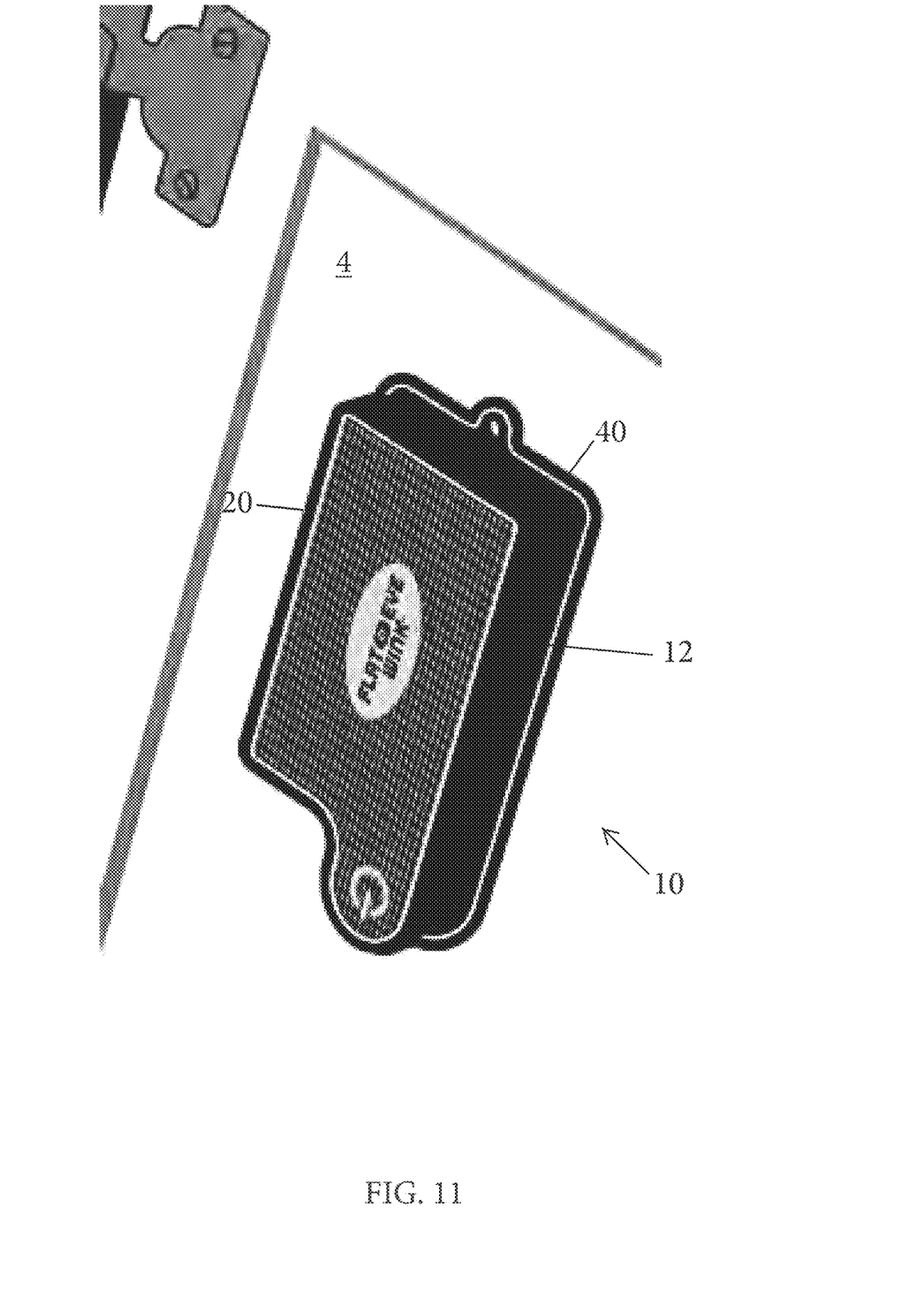
FIG. 11 is a perspective view of the flashlight of FIGS. 1 and 2 coupled to a door.

Alternatively or additionally, the flashlight 10 can include a second attachment structure 46 for mounting the flashlight 10 to a surface. The second attachment structure 46 can be a hook-and-loop fastener portion having a disk configuration which is adhesively coupled to the second housing member 30. The second attachment structure 46 detachably couples the flashlight 10 to a surface or structure having a corresponding hook-and-loop fastener portion secured thereto in order to conveniently store the flashlight 10 when not in use. In alternative forms, the second attachment structure 46 includes one or more adhesive pads and/or a magnet in place of or in addition to the hook-and-loop fastener disk 46 for detachably coupling the flashlight 10 to a surface for storage. For example, the flashlight 10 can be detachably coupled to the inside of a cabinet door 4, as shown in FIG. 11.

It will be understood that various changes in the details, materials, and arrangements of the parts and components that have been described and illustrated in order to explain the nature of the lighted components as described herein may be made by those skilled in the art within the principle and scope of this disclosure.

What is claimed is:
1. A flashlight comprising:
a housing;
a circuit board fixed in the housing and having opposite main surfaces with the circuit board oriented so that a first one of the main surfaces faces in a first direction and a second one of the main surfaces faces in a second, opposite direction;

a light source disposed on the second main surface of the circuit board;

an electrical contact mounted on the first main surface of the circuit board to be fixed in the housing;

a battery having opposite first and second ends and having a first terminal at the first end thereof; and a resilient, conductive band electrically coupled to the circuit board and engaging the second end of the battery to bias the first terminal in the second direction towards the electrical contact, wherein the conductive band is configured to electrically couple a second terminal of the battery to a second electrical contact on the second surface of the circuit board via a protrusion at an end of the conductive band extending in the first direction and into an aperture of the circuit board.

2. The flashlight of claim 1 further comprising a switch in the housing and being electrically coupled to the second surface of the circuit board.

3. The flashlight of claim 1 wherein the housing comprises an outer shell defining an internal cavity containing the circuit board, the light source, and the at least one battery, wherein the outer shell forms a watertight seal around the internal cavity.

4. The flashlight of claim 1 wherein the light source is mounted to the circuit board in a fixed orientation to project light in the first direction.

5. The flashlight of claim 1 wherein the battery comprises more than one battery, and the conductive band comprises more than one conductive band with each conducting band wrapping around a corresponding one of the batteries, and the batteries are electrically coupled to the light source in series via the circuit board.

6. The flashlight of claim 1 wherein the light source is a chip-on-board LED.

7. The flashlight of claim 2 wherein the housing includes a deformable actuator portion associated with the switch, and the switch is actuated by deforming the actuator portion of the housing to shift the switch between on and off states thereof.

8. An electrical device comprising:
a circuit board having a first main surface facing in a first direction;
a light source electrically coupled to the circuit board;
at least one electrical contact mounted on the first main surface of the circuit board;
an elongate battery having a first end proximate the circuit board and an opposite second end spaced distally from the circuit board, the battery having a first terminal on the first end thereof; and
a conductive band configured to wrap around the second end of the battery to extend along opposite sides of the battery and being coupled to the circuit board to bias the first terminal towards the at least one electrical contact, wherein the conductive band has a generally U-shaped configuration including two elongated side member portions extending along the opposite sides of the battery and a cross member connecting the elongated side member portions together, the elongated side member portions being coupled to the circuit board in apertures of the circuit board.

9. The electrical device of claim 8, wherein the band includes hook portions at the ends of the elongated side member portions, the hook portions being coupled to the circuit board.

10. The electrical device of claim 8 further comprising a switch operable to selectively provide power from the battery to the light source.

11. The electrical device of claim 8 wherein the light source is a chip-on-board LED.

12. The electrical device of claim 8 wherein the band is conductive and electrically couples a second terminal at the second end of the battery to the circuit board.

13. The electrical device of claim 8 further comprising a housing having:
a first housing portion defining a cavity containing the circuit board, the light source, the battery, and the band; and
a second housing portion bonded to the first portion to form a watertight seal to enclose the cavity.

14. The electrical device of claim 9 wherein the hook portions include protrusions configured to extend in the apertures in the circuit board.

15. The electrical device of claim 10 wherein the switch and the light source are coupled to a second main surface of the circuit board, the second main surface facing a direction different than the first direction.

* * * * *